United States Patent [19]

Kamisawa

[11] Patent Number: 5,291,436
[45] Date of Patent: Mar. 1, 1994

[54] FERROELECTRIC MEMORY WITH MULTIPLE-VALUE STORAGE STATES

[75] Inventor: Akira Kamisawa, Kyoto, Japan
[73] Assignee: Rohm Co., Ltd., Kyoto, Japan
[21] Appl. No.: 876,186
[22] Filed: Apr. 30, 1992

[30] Foreign Application Priority Data

Jul. 25, 1991 [JP] Japan .................................. 3-186195
Jul. 25, 1991 [JP] Japan .................................. 3-186196

[51] Int. Cl.$^5$ ........................ G11C 11/22; G11C 11/24
[52] U.S. Cl. .................................... 365/145; 365/149
[58] Field of Search ....................... 365/145, 149, 185

[56] References Cited

U.S. PATENT DOCUMENTS

| | | | |
|---|---|---|---|
| 4,510,516 | 4/1985 | Bartelink | 257/296 |
| 4,661,929 | 4/1987 | Aoki et al. | 365/149 |
| 4,853,893 | 8/1989 | Eaton, Jr. et al. | 365/145 |
| 5,189,594 | 2/1993 | Hoshiba | 365/145 |

FOREIGN PATENT DOCUMENTS 2304796 12/1990 Japan .

*Primary Examiner*—Eugene R. LaRoche
*Assistant Examiner*—Michael C. Kessell
*Attorney, Agent, or Firm*—Brumbaugh, Graves, Donohue & Raymond

[57] ABSTRACT

A ferroelectric memory using ferroelectric capacitors, in which a plurality of electrodes are juxtaposed on each of the two sides of one ferroelectric substance, and the electric fields between the electrodes are controlled, so that more than two different amounts of charges are provided by the ferroelectric capacitors formed by the electrodes. Thereby, the quantity of storage per ferroelectric cell is increased without increase of the cell area.

3 Claims, 4 Drawing Sheets

FERROELECTRIC MEMORY WITH MULTIPLE-VALUE STORAGE STATES

BACKGROUND OF THE INVENTION

1. Field of the Invention

This invention relates to a ferroelectric memory using ferroelectric capacitors.

2. Description of the Related Art

Recently, a ferroelectric capacitor has been employed as a memory to hold two valued charges. As for a memory of this type, a memory cell has been disclosed, for instance, by Unexamined Japanese Patent Application Hei-2-304796/(1991) FIG. 5 shows an electrical equivalent circuit of the memory cell, and FIG. 6 shows the structure of the same.

The memory cell, as shown in FIG. 5, comprises: a switching element, namely, a field-effect transistor 110, and a signal charge storing capacitor 120 using a ferroelectric substance. The field-effect transistor 110 has a gate electrode 111, a drain electrode 112, and a source electrode 113. The gate electrode 111 is connected to a word line WL, and the drain electrode 112 is connected to a bit line BL. The capacitor 120 comprises: a ferroelectric film 123; and two electrodes 121 and 122 formed on both sides of the ferroelectric film 123, respectively. The electrode 121 is connected to the source electrode 113 of the field-effect transistor 110, and the electrode 122 is connected to a ground line Vss or to a drive line DL. The ferroelectric film 123 is, in general, made of lead titanium zirconate (called "PZT").

The structure of the memory cell thus organized will be described with reference to FIG. 6 in brief.

A field oxide film 102 is formed by selective oxidation of the surface of a silicon substrate 101, thus defining a element forming region In the region, the field-effect transistor 110 is formed which consists of a gate electrode 111 covered by an oxide film 103, a drain region 112a, and a source region 113a. The lower electrode 121, the ferroelectric film 123, and the upper electrode 122 are formed on the source region 112a in the stated order, to form the capacitor 120. A metal conductor 104 is formed, as the bit line BL, on the drain region 112a, and a metal conductor 105 is formed, as the ground line Vss or the drive line DL, on the upper electrode 122.

The storage of charge of the ferroelectric capacitor in the above-described conventional non-volatile memory will be described with reference to FIGS. 7 and 8. FIG. 7 is an explanatory diagram showing the conventional capacitor formed on a semiconductor substrate. In FIG. 7, reference characters a and b designate the terminals of the capacitor. When voltage is applied across those terminals a and b of the capacitor, an amount of charge stored in the ferroelectric film 123 between the electrodes 121 and 122 is as shown in FIG. 8, in which the horizontal axis represents field strengths E and the vertical axis, amounts of polarization P. As the voltage between the terminals a and b changes, the amount of polarization of the ferroelectric film 123 changes as $0 \to A \to B \to C \to D \to E \to F \to G \to B$, thus showing a hysteresis characteristic.

When the field strength between the electrodes 121 and 122, after being raised to $E_{sat}$ much larger than $E_0$, is returned to 0, then an amount of polarization $P_s$ (called "spontaneous polarization") remains in the ferroelectric film 123. Similarly, when the field strength between the electrodes 121 and 122, after being decreased to $-E_{sat}$, is returned to 0, then an amount of polarization $-P_s$ remains in the ferroelectric film 123. With those positive and negative spontaneous polarizations corresponding to data "1" and "0" write states, the capacitor 120 provides a read signal charge Q represented by the following equation:

$$Q = 2P_s S \text{ (Coulomb)}$$

where S is the capacitor's area.

The spontaneous polarization $P_s$ is determined from the composition and thickness of the ferroelectric film 23.

In a conventional ferroelectric memory of this type, one ferroelectric capacitor holds binary charges. Hence, in order to provide multi-valued charges, it is necessary to provide as many ferroelectric capacitors as the number of charges required.

SUMMARY OF THE INVENTION

An object of this invention is to increase the quantity of storage per ferroelectric cell without increase of the cell area.

In a ferroelectric memory of the invention, at least one electrode is provided on one side of a ferroelectric substance, and at least two electrodes are provided on the other side of the ferroelectric substance, and, the electrode on the one side of the ferroelectric substance and the electrode on the other side are selected. Thus, different amounts of charge can be obtained as many as the combinations of electrodes thus selected.

For instance, one electrode A1 is provided on one side of one ferroelectric substance, and two electrodes B1 and C1 on the other side, and selecting means is provided to select one of the electrodes B1 and C1 on the other side of the ferroelectric substance in combination with the electrode A1 on the one side. That is, of the combinations of the electrodes A1 and B1, A1 and C1, and A1, B1 and C1, one is determined, so that three-valued charges can be obtained. Instead of the one ferroelectric substance, two ferroelectric substances may be employed in such a manner that they are juxtaposed appearing as one unit.

Furthermore, in a ferroelectric memory of the invention, in the case where two electrodes are formed on one side of one ferroelectric substance, and two electrodes are formed on the other side of the ferroelectric substance, and a pair of electrodes are selected from those electrodes in such a manner that one electrode is selected from the electrodes on the one side of the ferroelectric substance, and in combination with the electrode, another electrode is selected from the electrodes on the other sides of the ferroelectric substance. Thus, charges different in value can be obtained as many as the combinations of electrodes thus selected.

For instance, two electrodes A2 and B2 are provided side o by side on one side of one ferroelectric substance, and similarly two electrodes C2 and D2 are provided side by side on the other side. One electrode is selected from the electrodes A2 and B2 on the one side of the ferroelectric substance, and in combination with the electrode thus selected, one electrode is selected from the electrodes C2 and D2, thus providing four combinations of electrodes A2 and C2, A2 and D2, B2 and C2, and B2 and D2. Thus, four different amounts of charge can be obtained separately according to the four combinations of electrodes. Instead of the one ferroelectric substance, two ferroelectric substance may be employed in such a manner that they are juxtaposed so as to appear as one unit.

In the ferroelectric memory of the invention, one ferroelectric capacitor can hold a plurality of amounts of charge. That is, the ferroelectric memory of the invention is simple in structure, and yet serves as a memory element capable of storing a plurality of values.

Thus, the quantity of information per cell can be increased to ternary or higher. For instance, the quantity of information per cell can be increased from binary to ternary or quaternary. The quantity of information per cell area is markedly increased with the cell area maintained unchanged.

DESCRIPTION OF PREFERRED EMBODIMENTS

One preferred embodiment of this invention will be described with reference to the accompanying drawing.

Figure 1:
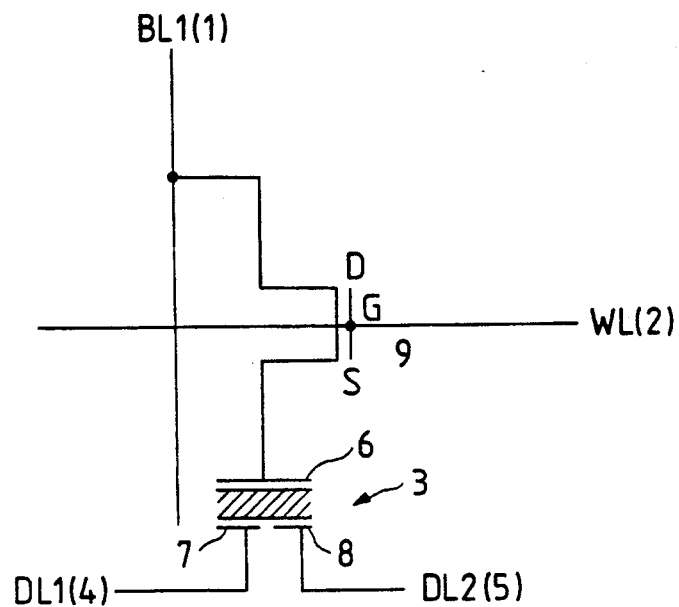
FIG. 1 is a circuit diagram showing one example of a ferroelectric memory according to this invention.
Figure 2:
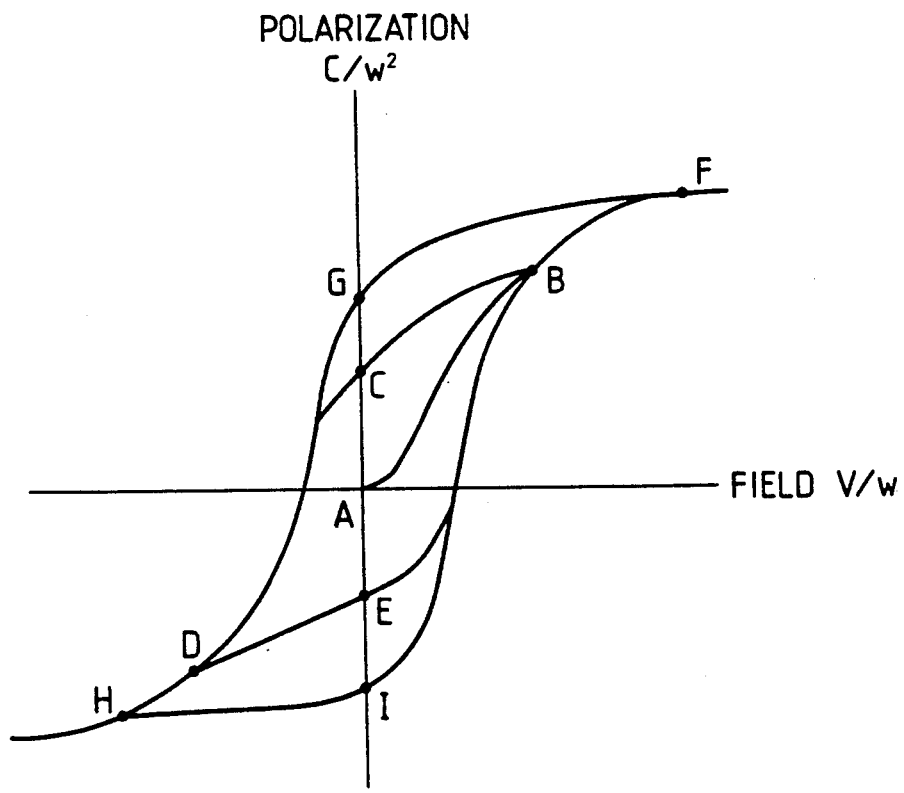
FIG. 2 is a diagram showing a field vs. polarization characteristic of the circuit shown in FIG. 1.

FIG. 1 is a circuit diagram showing an example of a ferroelectric memory. FIG. 2 is a diagram showing a field vs. polarization characteristic of the circuit shown in FIG. 1.

A ferroelectric capacitor 3, as shown in FIG. 1, has an electrode 6 relatively large in area on one surface of one ferroelectric substance, and two electrodes 7 and 8 relatively small in area on the other surface of the ferroelectric substance. The electrodes 7 and 8 are connected to reference potential lines 4 and 5, respectively. The reference potential lines 4 and 5 are maintained at ordinary reference potentials, preferably grounded, and can hold voltage pulses (not zero volt pulses) applied thereto. The electrode 6 on the one side of the capacitor 3 is coupled to a bit line 1 through the source and drain electrodes of a field-effect transistor (FET) 9.

The FET 9 shown in FIG. 1 is an N-channel device. Therefore, the drain electrode D of the FET 9 is connected to the bit line 1, and the source electrode S of the FET 9 is connected to the electrode 6 on the capacitor 3. In the embodiment, the N-channel device is employed; however, the invention is not limited thereto or thereby. That is, any other switching device may be employed instead of the N-channel device.

In the case where, in the ferroelectric memory shown in FIG. 1, the electrodes 6 and 7 are used, the field vs. polarization characteristic is the curve BD passing through the point C in FIG. 2; in the case where the electrodes 6 and 8 are used, the field vs. polarization characteristic is the curve DB passing through the point E; and in the case where the electrodes 6, 7 and 8 are used, the field vs. polarization characteristic is the FH passing through the points G and I.

Hence, by selecting one of the combinations of electrodes 6 and 7, 6 and 8, and 6, 7 and 8, more than three different amounts of charge C, E, G and I can be obtained.

Next, another embodiment of this invention will be described with reference to the accompanying drawing.

Figure 3:
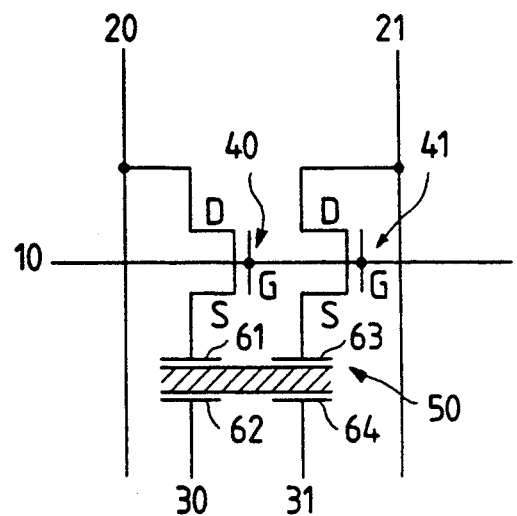
FIG. 3 is a circuit diagram showing another example of a ferroelectric memory according to this invention.
Figure 4:
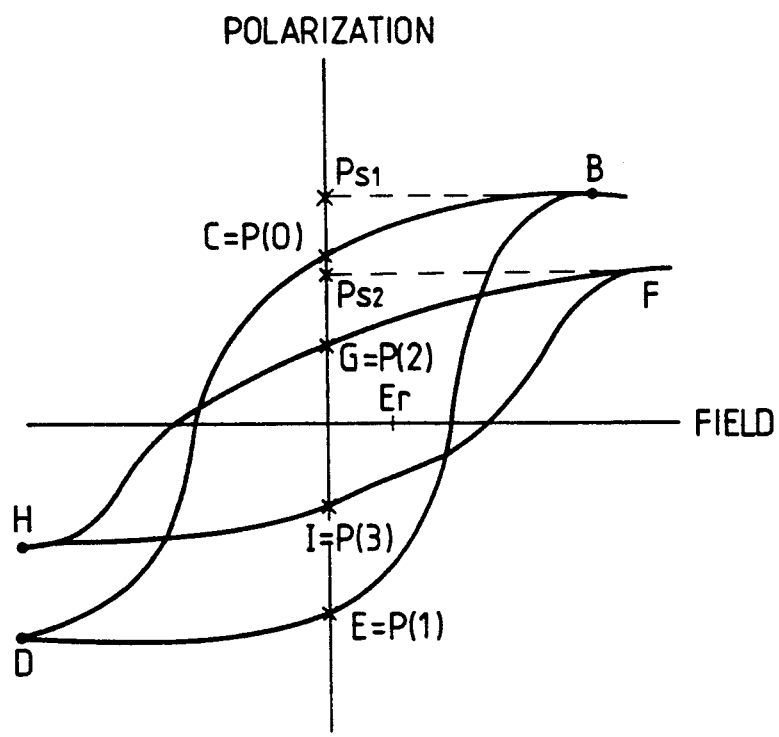
FIG. 4 is a diagram showing field vs. polarization characteristics of the circuit shown in FIG. 3.
Figure 5:
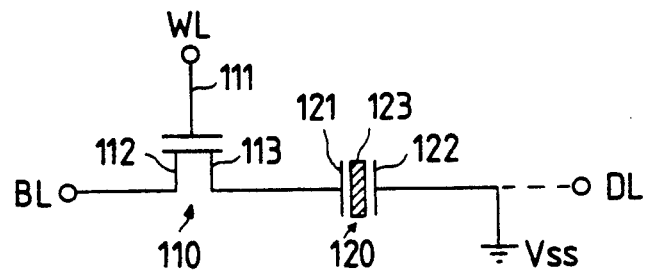
FIG. 5 is an electrical equivalent circuit diagram showing a conventional ferroelectric memory.
Figure 6:
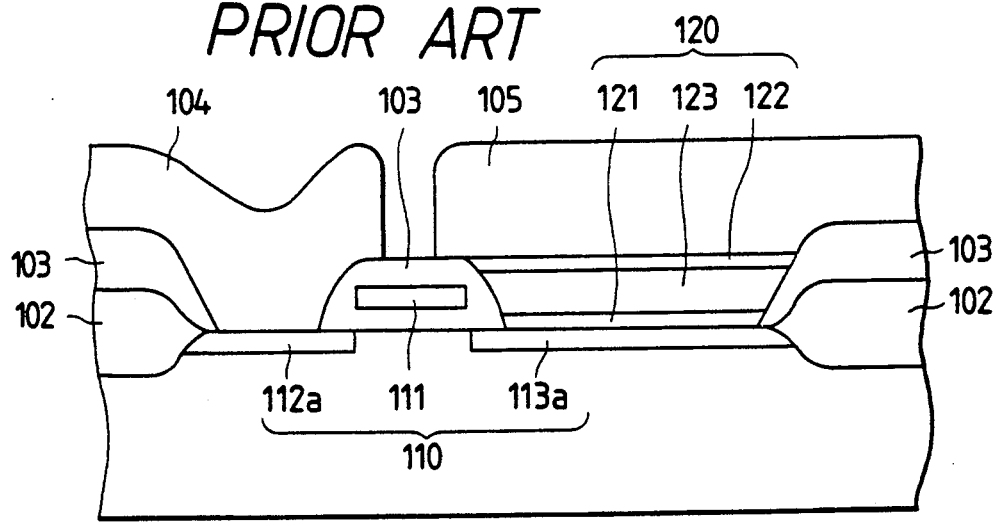
FIG. 6 is a sectional view showing the structure of the conventional ferroelectric memory shown in FIG. 5.
Figure 7:
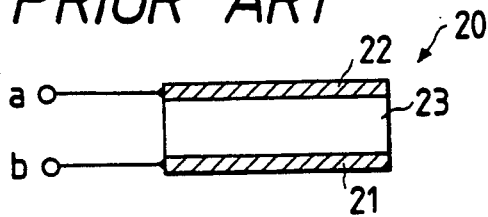
FIG. 7 is an explanatory diagram showing a conventional ferroelectric capacitor.
Figure 8:
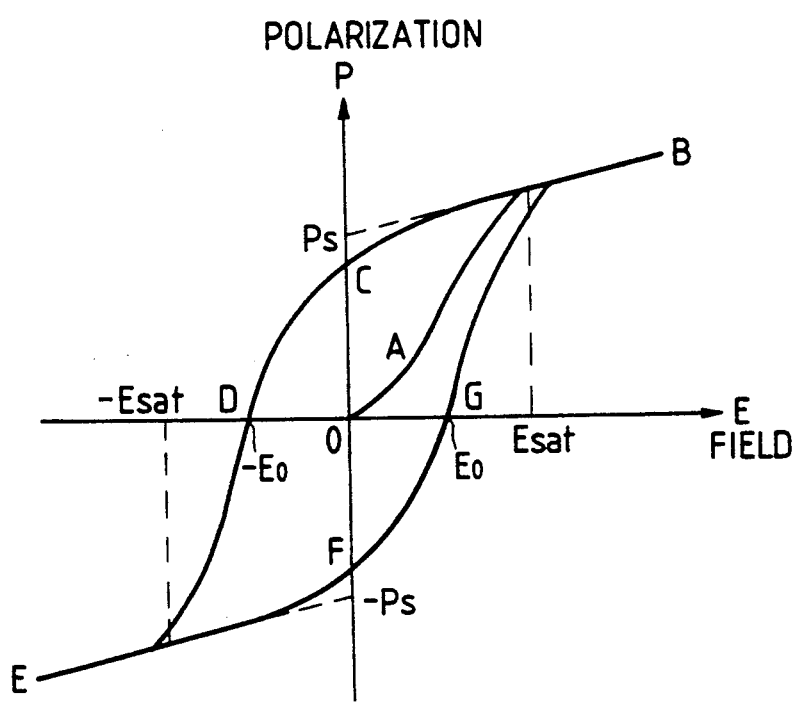
FIG. 8 is a characteristic diagram indicating field strengths between the electrodes of the ferroelectric capacitor shown in FIG. 7 with amounts of polarization of the ferroelectric substance of the latter.

FIG. 3 is a circuit diagram showing another example of a ferroelectric memory according to the invention. FIG. 4 is a diagram showing a field vs. polarization characteristic of the circuit shown in FIG. 3.

A ferroelectric capacitor, as shown in FIG. 3, has a plurality of electrodes 61 and 63 on one side of a ferroelectric substance and a plurality of electrodes 62 and 64 on the other side. The electrodes 62 and 64 are connected to reference potential lines 30 and 31, respectively; and the electrodes 61 and 63 are connected to field-effect transistors (FETs) 40 and 41, respectively. The reference potential lines 30 and 31 are at ordinary reference potentials, preferably grounded, and can hold voltage pulses (not zero voltage pulses) applied thereto. The electrodes 61 and 63 on the other side of the capacitor 50 are connected through the source and drain electrodes of the FETs 40 and 41 to bit lines 20 and 21, respectively.

The FETs 40 and 41 shown in FIG. 3 are N-channel devices. The drain electrodes of the FETs 40 and 41 are connected to the bit lines 20 and 21, respectively, and the sources are connected to the electrodes 61 and 63 on the one side of the capacitor 50, respectively. The gate electrodes of the FETs are connected to a word line 10 which is controlled separately. In the above-described embodiment, the N-Channel devices are employed; however, the invention is not limited thereto or thereby. That is, instead of the N-channel devices, other switching devices may be employed.

In the case where, in the ferroelectric memory shown in FIG. 3, the electrodes 61 and 62 are used, the field vs. polarization characteristic is the curve BD passing through the point C ($=$P(0)) in FIG. 4; in the case where the electrodes 63 and 64 are used, the field vs. polarization characteristic is the curve DB passing through the point E ($=$P(1)); in the case where the electrodes 61 and 64 are used, the field vs. polarization characteristic is the curve FH passing through the point G ($=$P(2)); and in the case where the electrode 63 and 62 are used, the field vs. polarization characteristic is the curve HF passing through the point I ($=$P(3)).

Hence, when the FETs 40 and 41 are turned on and off to select one of the combinations of electrodes 61 and 62, 63 and 64, 61 and 64, and 63 and 62, then four different amounts of charge P(0), P(2), P(3) and P(1) can be obtained.

As was described above, in the ferroelectric memory of the invention, a plurality of electrodes are formed side by side on one ferroelectric substance, and a suitable pulse electric field is applied across selected ones of the electrodes, so that the one ferroelectric memory has more than two valued polarization inversion states; that is, the capacity of storage per cell is increased as much.

As was described above, the ferroelectric memory of the invention comprises: the ferroelectric capacitor with a plurality of electrodes arranged side by side, and the switching device connected to the electrodes. Of the electrodes, a pair of ones are selected by the switching operation of the switching device, and a suitable electric field is applied across the electrodes thus selected, so that the ferroelectric memory has more than three different polarization inversion states. Thus, the quantity of information per cell of the ferroelectric capacitor is increased from binary to ternary or higher without increase of the cell area. That is, the quantity of information per cell is markedly increased with the cell area maintained unchanged, according to the invention.

What is claimed is:

1. A ferroelectric memory comprising:
   one electrode relatively large in area provided on a first side of a body of ferroelectric substance;
   two electrodes relatively small in area provided on a second side of the same body of ferroelectric substance;
   a first circuit for selecting one of said electrodes on said second side of said ferroelectric substance in combination with said electrode on said first side of said ferroelectric substance; and
   a second circuit for applying a pulse electric field across said electrodes thus selected and said electrode on said first side of said ferroelectric substance;
   whereby three values of polarization inversion states are provided by selectively combining said electrodes on said second side of said ferroelectric substance with said electrode on said first side of said ferroelectric substance.

2. A ferroelectric memory comprising:
   at least two electrodes provided on a first side of one ferroelectric substance;
   at least two electrodes provided on a second side of said ferroelectric substance;
   and circuit components for applying a pulse electric field between one electrode on said first side of said ferroelectric substance and one of the electrodes on said second side of said ferroelectric substance to provide at least three values of polarization inversion states.

3. A ferroelectric memory comprising:
   two electrodes provided on a first side of a ferroelectric substance;
   two electrodes provided on a second side of said ferroelectric substance;
   a first circuit for selecting one electrode from said two electrodes on said first side of said ferroelectric substance and one electrode from said two electrodes on said second side of said ferroelectric substance; and
   a second circuit for applying a pulse electric field across the two electrodes thus selected,
   wherein four values of polarization inversion states are provided by selection of said electrodes by said first circuit.

* * * * *

UNITED STATES PATENT AND TRADEMARK OFFICE
CERTIFICATE OF CORRECTION

PATENT NO. : 5,291,436
DATED : March 1, 1994
INVENTOR(S) : Akira Kamisawa

It is certified that error appears in the above-identified patent and that said Letters Patent is hereby corrected as shown below:

<u>Column 2, line 57</u>: The words "side o" should read --side--.

<u>Column 6, line 26</u>: The word "wherein" should read --whereby--.

Signed and Sealed this

Twenty-third Day of August, 1994

Attest:

BRUCE LEHMAN

Attesting Officer

Commissioner of Patents and Trademarks